United States Patent
Yamaguchi

(10) Patent No.: US 6,531,769 B2
(45) Date of Patent: Mar. 11, 2003

(54) SEMICONDUCTOR INTEGRATED CIRCUIT PACKAGE, SEMICONDUCTOR APPARATUS PROVIDED WITH A PLURALITY OF SEMICONDUCTOR INTEGRATED CIRCUIT PACKAGES, METHOD OF INSPECTING SEMICONDUCTOR INTEGRATED CIRCUIT PACKAGE AND METHOD OF FABRICATING SEMICONDUCTOR INTEGRATED CIRCUIT

(75) Inventor: Tadashi Yamaguchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/283,181

(22) Filed: Apr. 1, 1999

(65) Prior Publication Data

US 2001/0045636 A1 Nov. 29, 2001

(30) Foreign Application Priority Data

Nov. 20, 1998 (JP) .......................... 10/331080

(51) Int. Cl.[7] .............................. H01L 23/48
(52) U.S. Cl. ..................... 257/692; 257/694; 257/723; 257/778
(58) Field of Search ................ 257/692, 696, 257/685, 686, 737, 738, 777, 780

(56) References Cited

U.S. PATENT DOCUMENTS

| | | | | |
|---|---|---|---|---|
| 4,989,117 A | * | 1/1991 | Hernandez .................. 361/306 |
| 5,302,849 A | | 4/1994 | Cavasin | |
| 5,530,286 A | * | 6/1996 | Murakami et al. .......... 257/692 |
| 5,583,375 A | * | 12/1996 | Tsubosaki et al. .......... 257/692 |
| 5,840,599 A | | 11/1998 | Lamson et al. | |
| 5,886,404 A | * | 3/1999 | You ............................ 257/692 |
| 5,892,280 A | * | 4/1999 | Crane, Jr. et al. ........... 257/738 |
| 5,895,969 A | * | 4/1999 | Masuda et al. ............. 257/696 |
| 6,002,167 A | * | 12/1999 | Hatano et al. .............. 257/696 |
| 6,028,365 A | * | 2/2000 | Akram et al. ............... 257/778 |
| 6,060,768 A | | 5/2000 | Hayashida et al. | |

FOREIGN PATENT DOCUMENTS

| | | |
|---|---|---|
| JP | 1-232753 | 9/1989 |
| JP | 05-251585 | 9/1993 |
| JP | 06-097349 | 4/1994 |
| JP | 06-209069 | 7/1994 |
| JP | 06-236956 | 8/1994 |
| JP | 8-125066 | 5/1996 |
| JP | 08-306853 | 11/1996 |
| JP | 52-19971 | 2/1997 |
| JP | 09-162349 | 6/1997 |
| JP | 10-107198 | 4/1998 |
| JP | 10-189861 | 7/1998 |

* cited by examiner

Primary Examiner—Kamand Cuneo
Assistant Examiner—Lourdes Cruz
(74) Attorney, Agent, or Firm—Volentine Francos, PLLC

(57) ABSTRACT

The present invention provides a resin-sealed semiconductor IC package of a large integration size having a size substantially equal to that of its component semiconductor IC chip. The resin-sealed semiconductor IC package comprises a semiconductor IC chip, a plurality of leads arranged on the semiconductor IC chip and having end portions bent so as to extend perpendicularly to the major surface of the semiconductor IC chip, a resin molding sealing the semiconductor IC chip and the leads therein so that the tips of the end portions of the leads are exposed on one surface thereof, and conductive elements connected respectively to the exposed tips of the leads.

2 Claims, 13 Drawing Sheets

SEMICONDUCTOR INTEGRATED CIRCUIT PACKAGE, SEMICONDUCTOR APPARATUS PROVIDED WITH A PLURALITY OF SEMICONDUCTOR INTEGRATED CIRCUIT PACKAGES, METHOD OF INSPECTING SEMICONDUCTOR INTEGRATED CIRCUIT PACKAGE AND METHOD OF FABRICATING SEMICONDUCTOR INTEGRATED CIRCUIT

BACKGROUND OF THE INVENTION

1. Field of the Invention

The present invention relates to a semiconductor integrated circuit package (hereinafter referred to as "semiconductor IC package"), semiconductor apparatus provided with a plurality of semiconductor IC packages, a method of inspecting a semiconductor integrated circuit and a method of fabricating a semiconductor IC package.

2. Description of the Related Art

Various semiconductor IC packages have been proposed to meet the recent progressive increase in integration size.

For example, such semiconductor IC packages are proposed in JP-A Nos. 8-125066 (May 17, 1996) and 10-189861 (Jul. 21, 1998).

A lead frame needs to be processed by an etching technique to construct the semiconductor IC package proposed in the former cited reference. The etching technique needs many processes, takes much time to process the lead frame and has difficulty in forming the lead frame in a correct shape.

Middle parts of a plurality of leads must be bent upward and sideways to construct the semiconductor IC package proposed in the latter cited reference. However, it is practically difficult to bend the middle parts of the plurality of leads upward and sideways because the leads are arranged at small intervals.

SUMMARY OF THE INVENTION

Accordingly, it is a first object of the present invention to provide a resin-sealed semiconductor IC package having a large integration size and a size substantially equal to that of a semiconductor IC chip included therein.

A second object of the present invention is to provide a method of easily fabricating a resin-sealed semiconductor IC package provided with leads partly exposed on the surface of a resin package by well-controlled processes.

To achieve the first object, the present invention provides a resin-sealed semiconductor IC package comprising a semiconductor IC chip, a resin package covering the semiconductor IC chip, and a lead frame supporting the semiconductor IC chip, and having a plurality of leads arranged on the semiconductor IC chip, having end portions bent so as to extend perpendicularly to a major surface of the semiconductor IC chip and having tips exposed on the surface of the resin package and provided with conductive elements to be connected to external circuits.

The resin-sealed semiconductor IC package has a size substantially equal to that of the semiconductor IC chip.

To achieve the second object, the present invention provides a method of fabricating a resin-sealed semiconductor integrated circuit package comprising a semiconductor IC chip, a resin package covering the semiconductor IC chip, and a lead frame supporting the semiconductor IC chip, and having a plurality of leads having leads partly exposed on the surface of a resin package, comprising a step of bending end portions of the leads in a direction perpendicular to the surface of the semiconductor IC chip so that the tips of the end portions are exposed.

Since the method bends the end portions of the leads, the resin-sealed semiconductor IC package can easily be fabricated by well-controlled processes so that the leads are partly exposed o the surface of the resin package by conventional press working or the like.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

Preferred embodiments of the present invention will be described hereinafter with reference to the accompanying drawings, in which matters directly relating with the present invention will be described and the description of those not directly related with the present invention will be omitted. A first embodiment will be described with reference to FIGS. 1 and 2.

Figure 1:
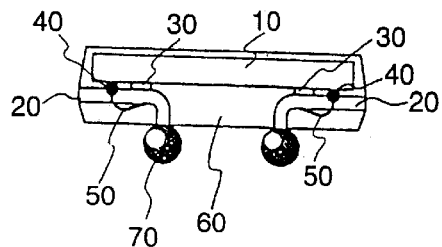
FIG. 1 is a sectional view of a resin-sealed semiconductor IC package in a first embodiment according to the present invention
Figure 2:
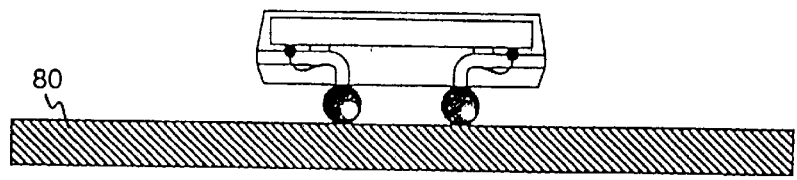
FIG. 2 is a plan view of assistance in explaining a method of fabricating the resin-sealed semiconductor IC package shown in FIG. 1.

FIGS. 1 and 2 are a sectional view and a plan view, respectively, of a resin-sealed semiconductor IC package in a first embodiment according to the present invention.

A plurality of leads 20 are arranged on a semiconductor IC chip 10 and are isolated from the semiconductor IC chip 10 by insulating tapes 30. The leads 20 are electrically connected to plurality of pads 40 formed on the semiconductor IC chip 10 with gold wires 50. The pads 40 are connected to an integrated circuit built in the semiconductor IC chip 10. These components are sealed in a resin molding 60.

Leads 20 are bent so that their end portions extend perpendicularly to a surface of the semiconductor IC chip 10. The tips of the end portions of the leads 20 are exposed on a surface of the resin molding 60. Electrodes 70 are formed on the exposed tips of the end portions of the leads 20.

Figure 3:
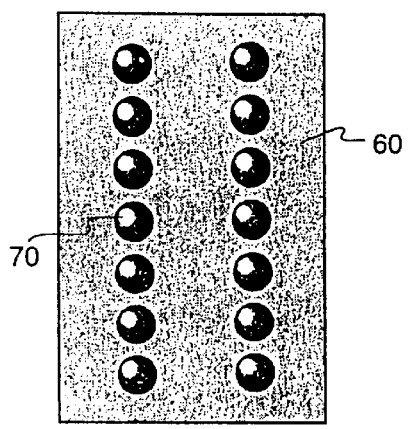
FIG. 3 is a sectional view of the resin-sealed semiconductor IC package in the first embodiment as mounted on a wiring board.

The electrodes 70 are electrically connected to circuits formed on a wiring board 80 as shown in FIG. 3. Some of the electrodes 70 are assigned to electric signals generated by the semiconductor IC chip, and the rest are assigned to external electric signals. In most cases, the electrodes 70 are formed of solder. In this embodiment, the electrodes 70 are formed of solder in a ball, however, the shape and the material of the electrodes are not limited thereto. For example, the electrodes 70 may be formed in a flat shape and may be formed of a conductive metal other than solder.

Figure 4:
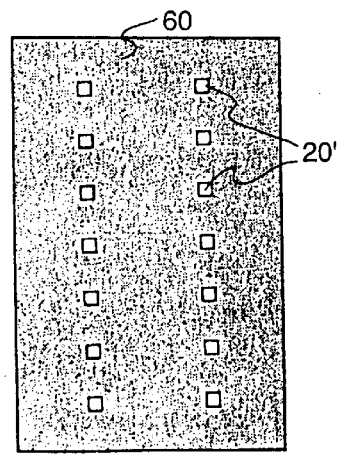
FIG. 4 is a typical view similar to FIG. 2, in which electrodes are omitted.

FIG. 4 is a plan view similar to FIG. 2, in which the electrodes 70 are omitted to facilitate understanding. As shown in FIG. 4, the tips 20' of the end portions of the leads 20 are exposed on the surface of the resin molding 60 so as to be electrically connected to the electrodes 70.

Although the exposed tips 20' of the end portions of the leads 20 shown in FIG. 4 are square, the tips 20' need not necessarily be square and may be formed in any suitable shape provided that the tips 20' can electrically be connected to the electrodes 70. If the leads 20 has the shape of a flat strip, the exposed tips 20' of the end portions of the leads 20 are rectangular. According to the inventor's knowledge, an optimum shape of the tips 20' of the end portions of the leads 20 is a square when the electrodes 70 are spherical.

Thus, the resin-sealed semiconductor IC package of a large integration size and a size substantially equal to that of the semiconductor IC chip can be realized.

A method of fabricating this resin-sealed semiconductor IC package will be described, in which only matters directly relating with the present invention will be described and the description of those not directly related with the present invention will be omitted. The matters which are not described herein will readily be understood from JP-A No. 8-227967.

Figure 5:
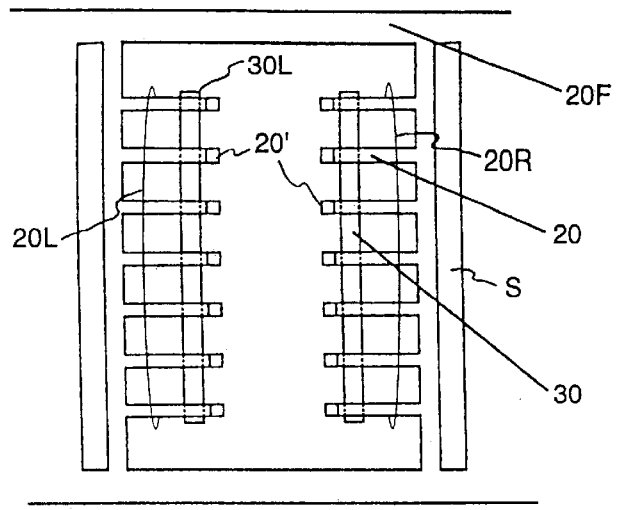
FIG. 5 is a plan view of assistance in explaining a method of fabricating the resin-sealed semiconductor IC package in the first embodiment.

First, referring to FIG. 5, a lead frame 20F provided with a plurality of leads 20 in a predetermined arrangement is set in place. Only one set of leads 20 for one semiconductor IC chip is shown in FIG. 5; actually, the lead frame 20F is provided with a plurality of sets of leads 20 arranged in a repetitive arrangement with a space S between the adjacent sets of leads 20.

End portions of the leads 20 of the lead frame 20F are bent perpendicularly, i.e., bent so as to extend out of the paper perpendicularly to the paper, by press working. When the leads 20 are combined with a semiconductor IC chip, the end portions of the leads 20 extend perpendicularly to the surface of the semiconductor IC chip.

The length of the thus bent end portions of the leads 20 is dependent on the thickness of a resin molding to be formed later. Since the tips of the end portions must be exposed on the surface of the resin molding, the length of the bent end portions of the leads increases when the thickness of the resin molding is increased, and vice versa. The length of the bent end portions of the leads is determined properly by the designer.

Insulating tapes 30R and 30L are attached adhesively to the lower surfaces of the leads of a right lead group 20R and to the lower surfaces of the leads of a left lead group 20L, respectively. The insulating tapes 30R and 30L are adhesive tapes as mentioned in the foregoing cited references. In this embodiment, the insulating tapes 30R and 30L are extended continuously on the right lead group 20R and the left lead group 20L, respectively. However, separate insulating tapes may be extended on the lower surfaces of the leads 20 or separate insulating pads may be attached only to the lower surfaces of the leads 20, respectively.

Figure 6:
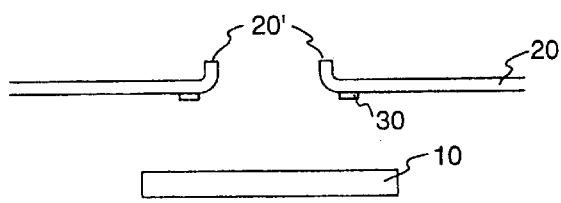
FIG. 6 is a sectional view of assistance in explaining the method of fabricating the resin-sealed semiconductor IC package in the first embodiment.

Then, as shown in FIG. 6, the leads 20 provided with the insulating tapes 30 are placed on the semiconductor IC chip 10 and the leads 20 are connected adhesively to a wiring surface of the semiconductor IC chip 10 by the insulating tapes 30.

Figure 7:
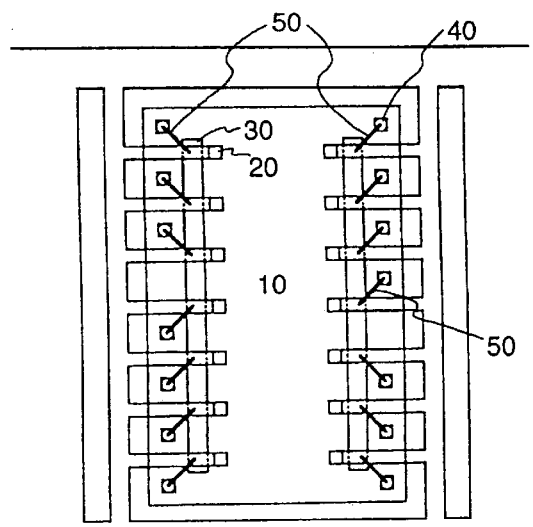
FIG. 7 is a plan view of assistance in explaining the method of fabricating the resin-sealed semiconductor IC package in the first embodiment.
Figure 8:
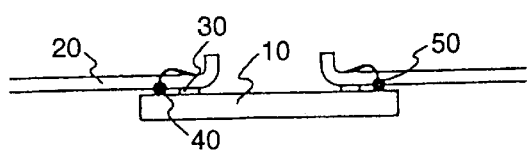
FIG. 8 is a sectional view of assistance in explaining the method of fabricating the resin-sealed semiconductor IC package in the first embodiment.

Subsequently, as shown in FIGS. 7 and 8 in a plan view and a sectional view, the plurality of leads 20 are connected electrically to corresponding pads 40 of the semiconductor IC chip 10 with gold wires 50 by a known wire bonding process. The leads 20 may be connected to the pads 40 by any suitable conductive means having a high conductivity other than the gold wires 50, provided that the leads 20 and the pads 40 are electrically connected.

Figure 9:
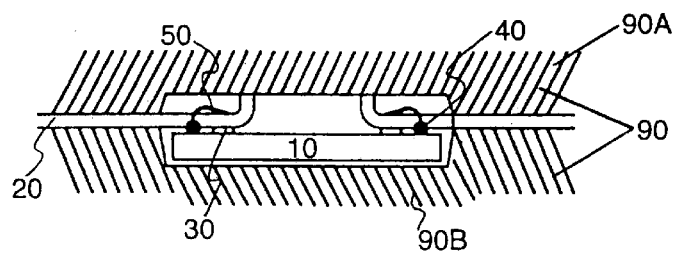
FIG. 9 is a sectional view of assistance in explaining the method of fabricating the resin-sealed semiconductor IC package in the first embodiment.
Figure 10:
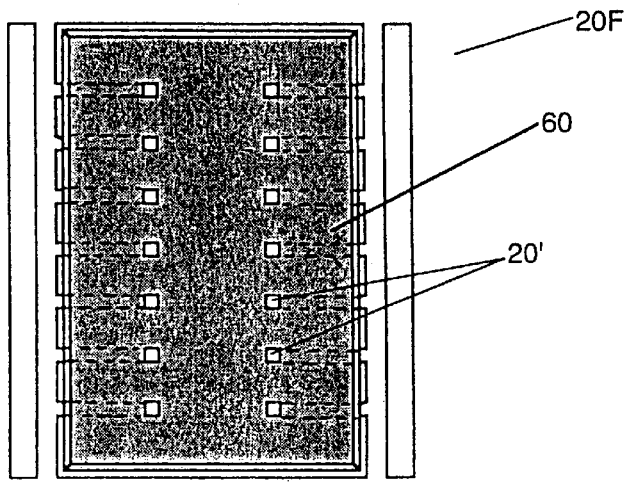
FIG. 10 is a plan view of assistance in explaining the method of fabricating the resin-sealed semiconductor IC package in the first embodiment.
Figure 11:
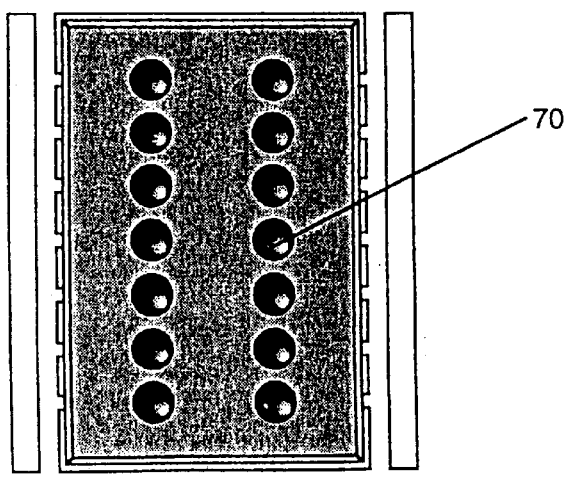
FIG. 11 is a plan view of assistance in explaining the method of fabricating the resin-sealed semiconductor IC package in the first embodiment.

A structure constructed by electrically connecting the leads 20 and the semiconductor IC chip 10 as shown in FIGS. 7 and 8 is held in a cavity of a mold 90 having an upper half mold 90A and a lower half mold 90B with the tips 20' of the end portions of the leads 20 in contact with the inner surface of the upper half mold 90A as shown in FIG. 9, and a sealing resin, such as an epoxy resin, is injected into the cavity of the mold 90 to seal the structure in the resin molding 60. Since the tips 20' of the leads 20 are in contact with the inner surface of the upper half mold 90A, the tips 20' of the leads 20 are exposed on a surface of the resin molding 60 as shown in FIG. 10. The electrodes 70 having the shape of a ball are formed by connecting solder to the exposed tips 20' of the leads 20. The electrodes 70 may be formed in a flat shape and may be formed of a conductive metal instead of solder.

Then, the lead frame 20F provided with a plurality of resin-sealed semiconductor IC packages is subjected to press working to cut portions of the leads 20 projecting outside from the resin moldings 60, so that the resin-sealed semiconductor IC packages are separated to provide individual resin-sealed semiconductor IC packages as shown in FIG. 1. Since this method can use a known processing method, such as press working, the resin-sealed semiconductor IC package provided with the leads partly exposed on the surface of the resin molding 60 can be fabricated by well-controlled processes at low manufacturing costs.

A resin-sealed semiconductor IC package in a second embodiment according to the present invention will be described below, in which parts like or corresponding to those of the first embodiment are designated by the same reference characters and the description thereof will be omitted.

The second embodiment is featured by the arrangement of electrodes. In the second embodiment, tips of leads exposed on a surface of a resin molding are disposed in a zigzag arrangement, and hence electrodes connected to the tips of the leads are disposed in a zigzag arrangement.

Figure 12:
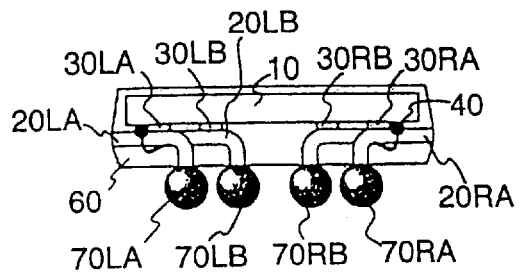
FIG. 12 is a sectional view of a resin-sealed semiconductor IC package in a second embodiment according to the present invention.
Figure 13:
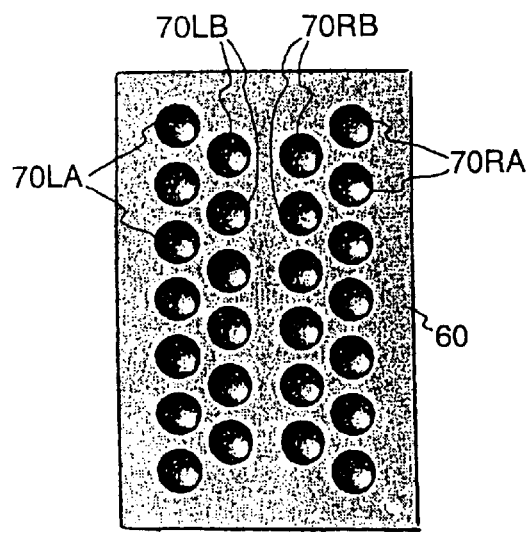
FIG. 13 is a plan view of the resin-sealed semiconductor IC package shown in FIG. 12.
Figure 14:
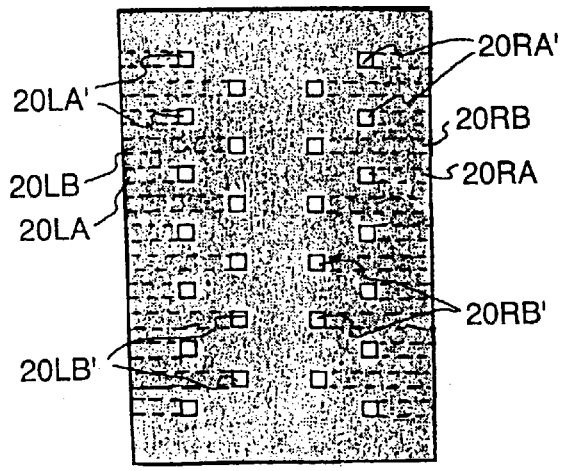
FIG. 14 is a typical plan view similar to FIG. 12, in which electrodes are omitted.

FIG. 12 is a sectional view of a resin-sealed semiconductor IC package in the second embodiment according to the present invention, FIG. 13 is a plan view showing electrodes of the resin-sealed semiconductor IC package shown in FIG. 12, and FIG. 14 is a typical plan view similar to FIG. 13, in which electrodes are omitted to facilitate understanding the arrangement of the exposed tips of leads. The second embodiment will be described with reference to FIGS. 12, 13 and 14.

In the second embodiment, a plurality of short leads 20RA and 20LA, and a plurality of long leads 20RB and 20LB of a length greater than that of the short leads 20RA and 20LA are arranged alternately on a semiconductor IC chip 10. More specifically, the short leads 20RA and the long leads 20RB are arranged alternately in a right region, as viewed in FIG. 13, and the short leads 20LA and the long leads 20LB are arranged alternately in a left region, as viewed in FIG. 13. The respective lengths of the short leads and the long leads are determined properly by the designer taking into consideration the pitches of the leads or intervals between the adjacent leads and the size of electrodes to be formed on the tips of the leads. These leads are connected adhesively by insulating tapes 30RA, 30LA, 30RB and 30LB to the semiconductor IC chip. The leads 20 are electrically connected to plurality of pads 40 formed on the semiconductor IC chip 10 with gold wires 50. The pads 40 are connected to an integrated circuit built in the semiconductor IC chip 10. These components are sealed in a resin molding 60.

The leads, similarly to those of the first embodiment, are bent so that their end portions extend perpendicularly to a surface of the semiconductor IC chip 10. The tips 20RA', 20LA', 20RB' and 20LB' of the end portions of the leads are exposed on a surface of the resin molding 60. The tips 20LA' and 20LB' of the leads are arranged on parallel straight lines, respectively, and the tips 20RA' and 20RB' of the leads are arranged on two parallel straight lines, respectively. Electrodes 70RA, 70LA, 70RB and 70LB are formed on the exposed tips 20RA', 20LA', 20RB' and 20LB', respectively. Accordingly, the electrodes 70RA, 70LA, 70RB and 70LB are arranged on parallel straight lines, respectively. The resin-sealed semiconductor IC package in the second embodiment of the foregoing construction can be formed in an integration size greater than that of the resin-sealed semiconductor IC package in the first embodiment.

The pitches of the leads (intervals between the adjacent leads) are determined taking into consideration the size of the electrodes and such. In the resin-sealed semiconductor IC package in the first embodiment, the size of the electrodes is more dominant than the width of the leads over the determination of the pitches of the leads and hence the pitches of the leads must be relatively great.

In the resin-sealed semiconductor IC package in the second embodiment, the electrodes are disposed in a zigzag arrangement and intervals between the adjacent electrodes are relatively great. Therefore, the size of the electrodes is not a dominant factor in determining the pitches of the leads, which increases the degree of freedom of design and enables the arrangement of a plurality of leads at relatively small pitches. Consequently, the resin-sealed semiconductor IC package can be formed in an increased integration size.

A method of fabricating this resin-sealed semiconductor IC package will be described. What cannot be known from the following description will readily be understood by making reference to the foregoing description.

Figure 15:
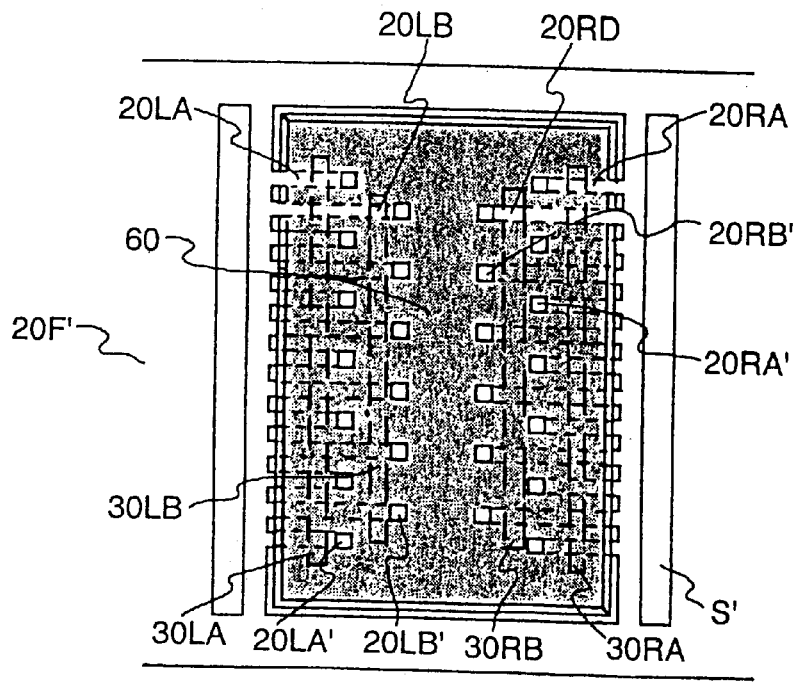
FIG. 15 is a plan view of assistance in explaining a method of fabricating the resin-sealed semiconductor IC package in the second embodiment.
Figure 16:
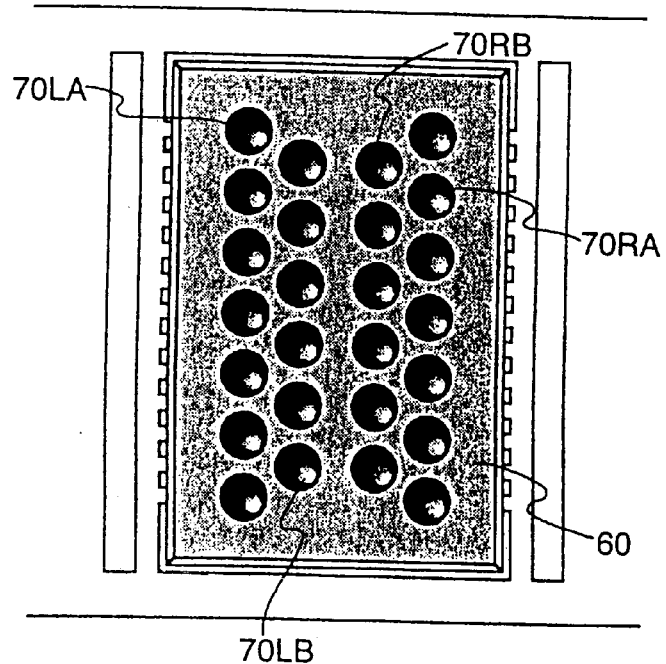
FIG. 16 is a plan view of assistance in explaining the method of fabricating the resin-sealed semiconductor IC package in the second embodiment.

Referring to FIG. 15, a lead frame 20F' provided with short leads 20RA and 20LA and long leads 20RB and 20LB of a length greater than that of the short leads 20RA and 20LA in a predetermined arrangement is set in place. The short leads 20RA and the long leads 20RB are arranged alternately in a right region, as viewed in FIG. 15, and the short leads 20LA and the long leads 20LB are arranged alternately in a left region, as viewed in FIG. 15. The length of the long leads 20RB and 20LB, i.e., distance between the joint of each long lead and a frame, and the tip of the lead, is greater than that of the short leads 20RA and 20LA; that is, the distance between a side of the resin-sealed semiconductor IC package through which the leads are extended into the resin-sealed semiconductor IC package and the tip of each of the long leads 20RB and 20LB is greater than the distance between the same side of the resin-sealed semiconductor IC package and the tip of each of the short leads 20RA and 20LA. Only one set of leads for one semiconductor IC chip is shown in FIG. 15; actually, the lead frame 20F' is provided with a plurality of sets of leads arranged in a repetitive arrangement with a space S' between the adjacent sets of leads.

End portions having tips 20RA', 20RB', 20LA' and 20LB' of the leads of the lead frame 20F' are bent perpendicularly, i.e., bent so as to extend out of the paper perpendicularly to the paper, by press working. When the leads are combined with a semiconductor IC chip, the end portions of the leads extend perpendicularly to the surface of the semiconductor IC chip.

The length of the thus bent end portions of the leads, similarly to that of the bent end portions of the leads in the first embodiment, is dependent on the thickness of a resin molding to be formed later. Since the tips of the end portions must be exposed on the surface of the resin molding, the length of the bent end portions of the leads increases when the thickness of the resin molding is increased, and vice versa. The length of the bent end portions of the leads is determined properly by the designer.

Insulating tapes 30RA and 30RB are attached adhesively to the lower surfaces of the leads of lead groups 20RA and 20RB, and insulating tapes 30LA and 30LB are attached to the lower surfaces of the leads of lead groups 20LA and 20LB. As mentioned in the cited reference, the insulating tapes are double-coated adhesive tapes. The shapes of the insulating tapes are not limited to those shown in FIG. 15; separate insulating tapes may be extended on the lower surfaces of the leads or separate insulating pads may be attached only to the lower surfaces of the leads, respectively.

Then, the leads provided with the insulating tapes are placed on the semiconductor IC chip 10 and the leads are connected adhesively to a wiring surface of the semiconductor IC chip 10 by the insulating tapes.

Subsequently, the plurality of leads are connected electrically to corresponding pads 40 of the semiconductor IC chip 10 with gold wires 50. The leads may be connected to the pads 40 by any suitable conductive means having a high conductivity other than the gold wires 50, provided that the leads and the pads 40 are electrically connected.

A structure constructed by electrically connecting the leads and the semiconductor IC chip 10, similarly to that mentioned in connection with the first embodiment, is held in a cavity of a mold with the tips of the end portions of the leads in contact with the inner surface of the mold, and a sealing resin is injected into the cavity of the mold to seal the structure in a resin molding 60. Since the tips of the leads are in contact with the inner surface of the mold, the tips of the leads are exposed on a surface of the resin molding 60 as shown in FIG. 15. Electrodes 70RA, 70RB, 70LA and 70LB having the shape of a ball are formed by connecting solder to the exposed tips of the leads 20RA, 20RB, 20LA and 20LB. The electrodes 70RA, 70RB, 70LA and 70LB may be formed in a flat shape and may be formed of a conductive metal instead of solder.

Then, the lead frame 20F' provided with a plurality of resin-sealed semiconductor IC packages is subjected to press working to cut portions of the leads projecting outside from the resin moldings 60, so that the resin-sealed semiconductor IC packages are separated to provide individual resin-sealed semiconductor IC packages as shown in FIG. 12.

Since this method can use a known processing method, such as press working, the resin-sealed semiconductor IC package provided with the leads partly exposed on the surface of the resin molding 60 can be fabricated by well-controlled processes. Accordingly, the resin-sealed semiconductor IC package of a large integration size can be fabricated at low manufacturing costs. A resin-sealed semiconductor IC package in a third embodiment according to the present invention will be described below, in which parts like or corresponding to those of the first and the second embodiment are designated by the same reference characters and the description thereof will be omitted.

The third embodiment is featured by the shape of a resin molding.

Figure 17:
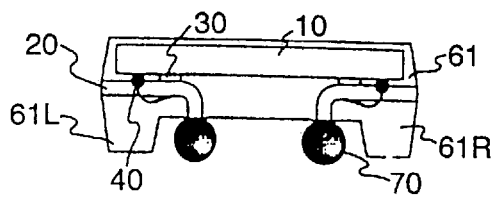
FIG. 17 is a sectional view of a resin-sealed semiconductor IC package in a third embodiment according to the present invention.
Figure 18:
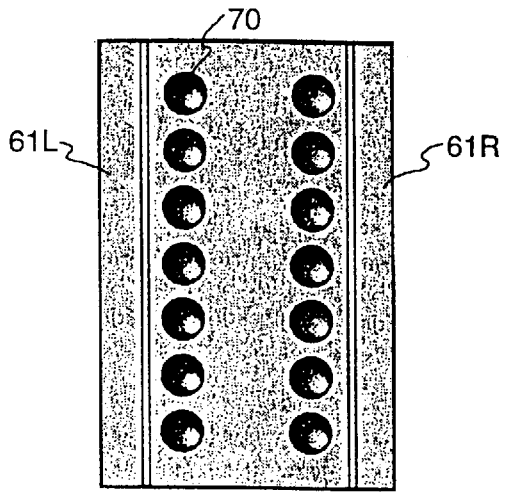
FIG. 18 is a plan view of the resin-sealed semiconductor IC package shown in FIG. 17.

As shown in FIGS. 17 and 18, a resin molding 61 is provided integrally with protrusions 61R and 61L formed so as to extend near electrodes 70. The protrusions 61R and 61L project from a surface of the resin molding 61 on which the electrodes 70 are formed. The protrusions 61R and 61 are the same in height.

The height of protrusions 61R and 61 is determined taking into consideration the height of the electrodes 70 from the tips 20' of leads and the change of the height of the electrodes 70 when the electrodes 70 are melted in mounting the resin-sealed semiconductor IC package on a wiring board 80'.

Figure 19:
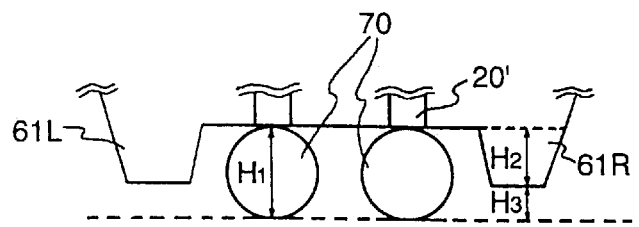
FIG. 19 is an enlarged, fragmentary view showing the relation between a protrusion in a resin molding and electrodes.
Figure 19:
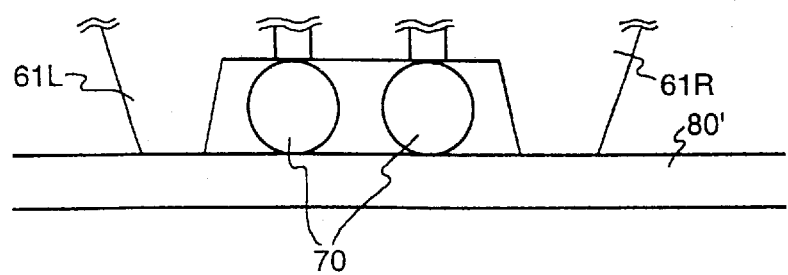
Figure 20:
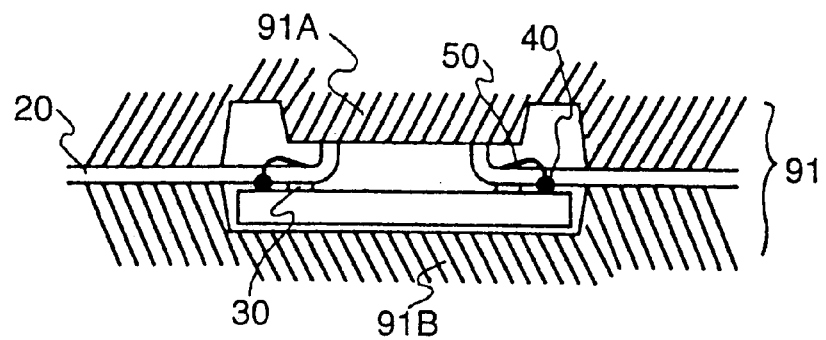
FIG. 20 is a sectional view of assistance in explaining a method of fabricating the resin-sealed semiconductor IC package in the third embodiment.

Referring to FIG. 19(A), the electrodes 70 have a height H1 greater than the height H2 of the protrusions 61R and 61L by a value H3 before the resin-sealed semiconductor IC package is attached to the wiring board 80'; that is, the height H2 of the protrusions 61R and 61L is smaller by the value H3 than the height H1 of the electrodes 70.

As shown in FIG. 19(B), the value H3 corresponds to the thickness of portions of the electrodes 70 to be melted when attaching the resin-sealed semiconductor IC package to the wiring board 80'.

Thus, the lower surface of the resin-sealed semiconductor IC package is spaced a distance corresponding to the height H2 of the protrusions 61R and 61L apart from the surface of the wiring board 80', and hence the resin-sealed semiconductor IC package can surely be mounted on the wiring board 80'. The protrusions 61R and 61L extending near the electrodes 70 protects the electrodes 70 from various forces that may be exerted on the electrodes 70 during transportation.

The resin molding 61 having the protrusions 61R and 61L is molded by using a mold 91 having an upper half mold 91A and a lower half mold 91B defining a cavity of a shape corresponding to the resin molding 61.

Figure 21:
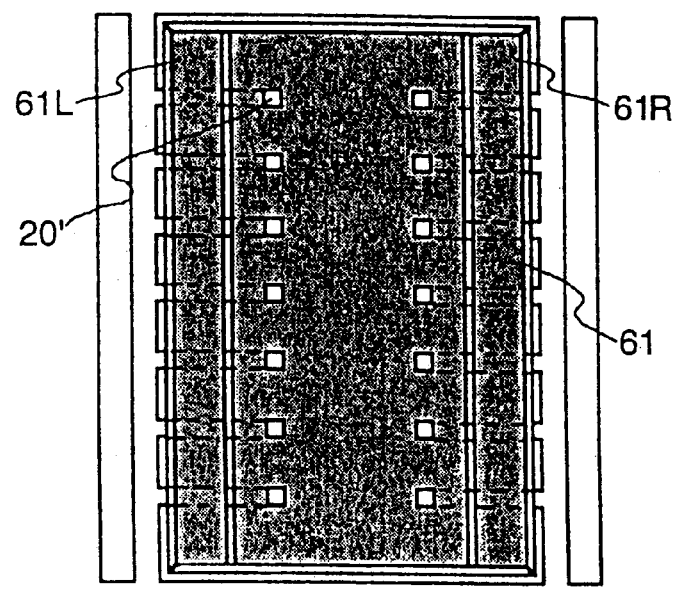
FIG. 21 is a plan view of assistance in explaining the method of fabricating the resin-sealed semiconductor IC package in the third embodiment.

A structure constructed by combining the semiconductor IC chip and the leads is held in the cavity of the mold 91 with the tips 20' of the leads 20 in contact with the inner surface of the upper half mold 91A, and a sealing resin, such as an epoxy resin, is injected into the cavity of the mold 91 to seal the structure in the resin molding 61. Since the tips 20' of the leads 20 are in contact with the inner surface of the upper half mold 91A, the tips 20' of the leads 20 are exposed on a surface of the resin molding 61 as shown in FIG. 21.

Since this method can use a known processing method, such as press working, for bending end portions of the leads, the resin-sealed semiconductor IC package provided with the leads partly exposed on the surface of the resin molding 61 can be fabricated by well-controlled processes. Accordingly, the resin-sealed semiconductor IC package capable of being surely mounted on the wiring board can be fabricated at low manufacturing costs.

A resin-sealed semiconductor IC package in a fourth embodiment according to the present invention will be described below, in which parts like or corresponding to those of the foregoing embodiments are designated by the same reference characters and the description thereof will be omitted.

The fourth embodiment is featured by recesses of a shape corresponding to that of electrodes, formed in a resin molding around exposed tips of leads.

Figure 22:
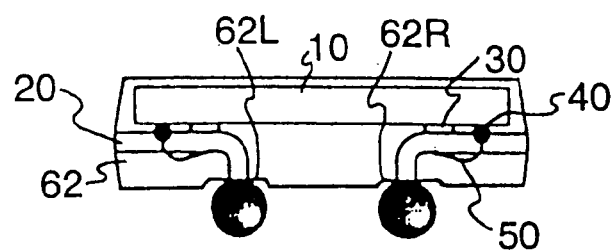
FIG. 22 is a sectional view of a resin-sealed semiconductor IC package in a fourth embodiment according to the present invention.
Figure 23:
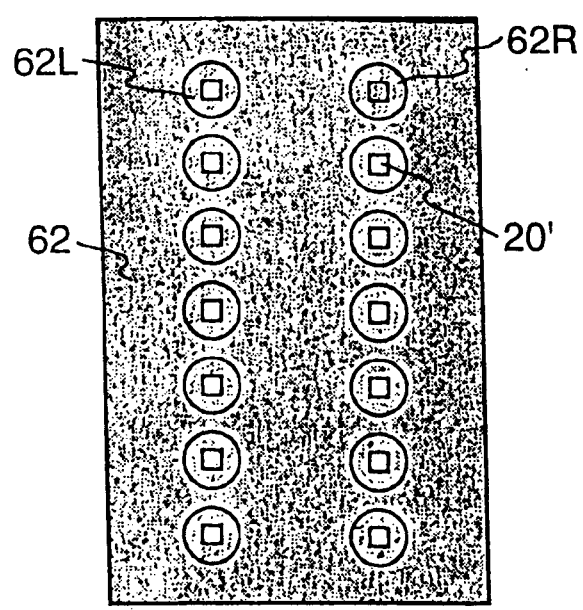
FIG. 23 is a plan view of the resin-sealed semiconductor IC package shown in FIG. 22, in which electrodes are omitted.

As shown in FIGS. 22 and 23, a resin molding 62 is provided in a surface thereof in which the tips 20' of leads are exposed with recesses 62R and 62L around the tips 20'. The tips 20' are exposed in the bottom surfaces of the recesses 62R and 62L. Electrodes 70 are connected electrically to the exposed tips 20' of the leads in the recesses 62R and 62L. In this embodiment, the electrodes 70 are substantially spherical, and hence the recesses 62R and 62L are substantially hemispherical. The electrodes 70 may be formed in a flat shape, and the recesses may be formed in a square shape in plane.

The resin molding 62 provided with the recesses 62R and molded by using a mold 92 having an upper half mold 92A and a lower half mold 92B defining a cavity of a shape corresponding to the resin molding 62. The upper half mold 92A is provided on its inner surface with protrusions corresponding to the recesses 62R and 62L.

Figure 24:
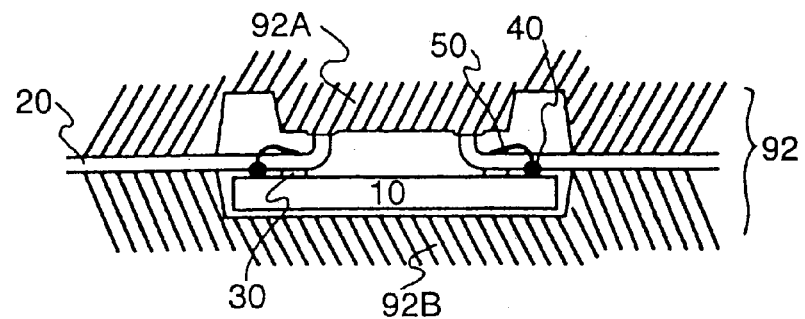
FIG. 24 is a sectional view of assistance in explaining a method of fabricating the resin-sealed semiconductor IC package in the fourth embodiment.
Figure 25:
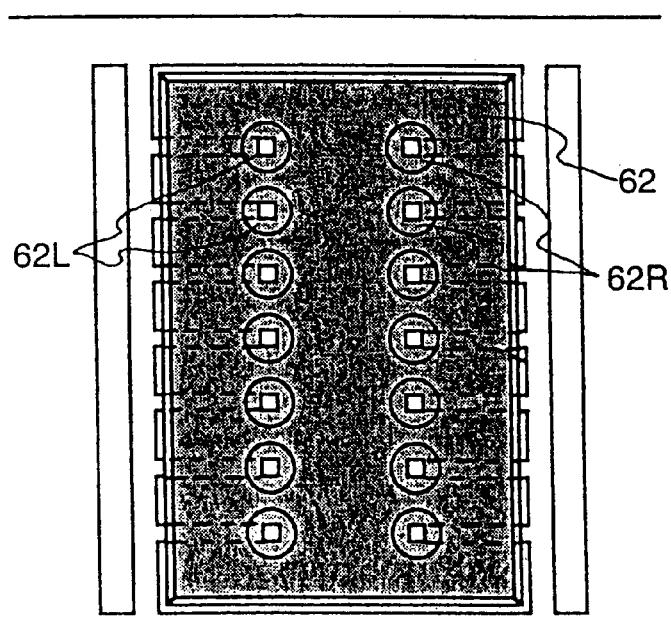
FIG. 25 is a plan view of assistance in explaining the method of fabricating the resin-sealed semiconductor IC package in the fourth embodiment.

As shown in FIG. 24, a structure constructed by combining the semiconductor IC chip and the leads is held in the cavity of the mold 92 with the tips 20' of the leads in contact with the inner surface of the upper half mold 92A, and a sealing resin, such as an epoxy resin, is injected into the cavity of the mold 92 to seal the structure in the resin molding 62. Since the tips 20' of the leads are in contact with the inner surface of the upper half mold 92A, the tips 20' of the leads are exposed on the bottom surfaces of the recesses 62R and 62L of the resin molding 62 as shown in FIG. 25.

This method has the following effects in addition to those described above in connection with the foregoing embodiments. Since the tips to be connected to electrodes are exposed on the surface of the resin molding, the positions of the leads and the electrodes can easily recognized and reliability is improved. When forming the of solder, a highly fluidic flux is applied to the bottom surfaces of the recesses prior to forming the electrodes. Therefore, the possibility of the flux spreading on the resin molding can greatly be reduced.

A resin-sealed semiconductor IC package in a fifth embodiment according to the present invention will be described below, in which parts like or corresponding to those of the foregoing embodiments are designated by the same reference characters and the description thereof will be omitted.

The fourth embodiment is featured by tips of leads formed in the shape of a circular arc in section corresponding to the shape of part of electrodes.

Figure 26:
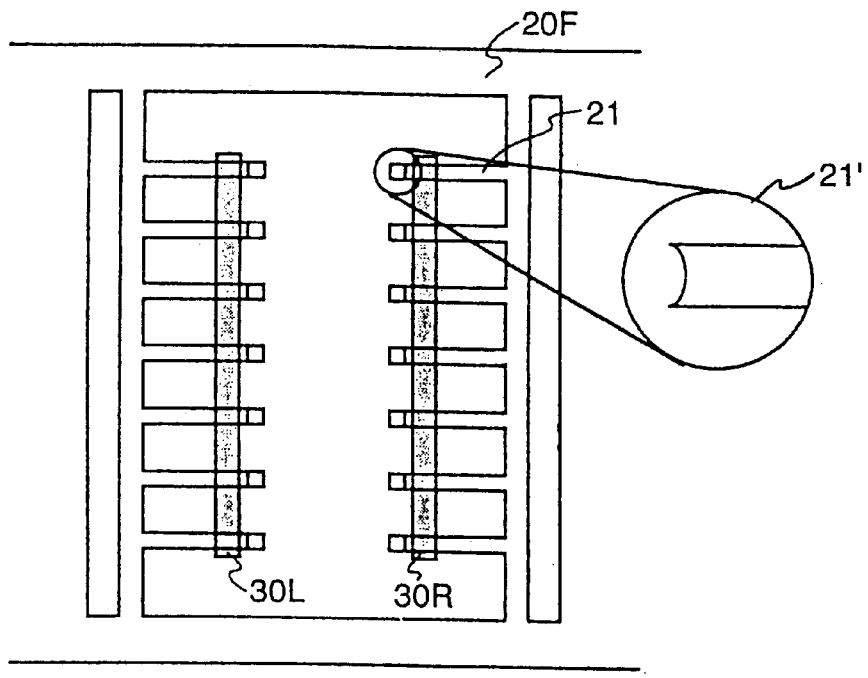
FIG. 26 is an enlarged plan view of a lead frame employed in the firth embodiment.

As shown in an enlarged view in FIG. 26, tips 21' of leads 21 are formed in the shape of a circular arc in section corresponding to the shape of part of spherical electrodes 70.

The fifth embodiment has the following effects in addition to those of the foregoing embodiments. The reliability of the connection of the leads and the electrodes is further enhanced because the contact area of the tips of the lead having the shape of a circular arc in section is greater than that of flat tips.

A resin-sealed semiconductor IC package in a sixth embodiment according to the present invention will be described below, in which parts like or corresponding to those of the foregoing embodiments are designated by the same reference characters and the description thereof will be omitted.

A resin-sealed semiconductor IC package in the sixth embodiment is similar to the first embodiment, except that the resin-sealed semiconductor IC package in the sixth embodiment is provided with leads having end portions projecting from side surfaces of the resin molding of the resin-sealed semiconductor IC package.

Figure 27:
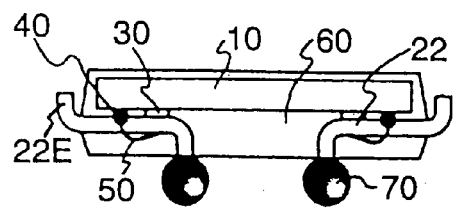
FIG. 27 is a sectional view of a resin-sealed semiconductor IC package in a sixth embodiment according to the present invention.
Figure 28:
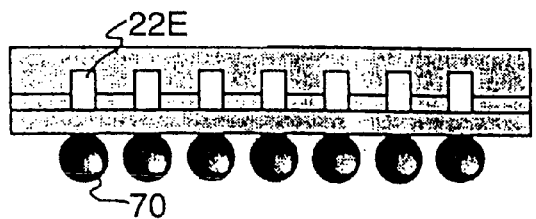
FIG. 28 is a side view of the resin-sealed semiconductor IC package shown in FIG. 27.

As shown in FIG. 27 and 28, leads 22 has extensions 22E projecting outside from the side surfaces of a resin molding 60. Tips of other end portions 22' of the leads 22 opposite the extensions 22E are connected to electrodes 70.

The extensions 22E of the leads 22 are bent so as to extend in a direction opposite a direction in which the other end portions 22' extend. The extensions 22E of the leads 22 may be bent so as to extend along the side surfaces of the resin molding 60 in the same direction as the other end portions 22'. When testing the electrical characteristic of the resin-sealed semiconductor IC package, which will be described later, probes are brought into contact with the extensions 22E. It is desirable to bend the extensions 22E as shown in FIGS. 27 and 28 in view of facilitating work for bringing the probes into contact with the extensions 22E.

Usually, when testing the electrical characteristic of resin-sealed semiconductor IC packages of this kind, the probes of a testing device are brought into contact with electrodes (the electrodes 70 in this embodiment). Sometimes, the electrodes are chipped or deformed when the probes are brought into contact with the electrodes because, generally, the electrodes are formed of a soft metal, such as solder.

It is very difficult to achieve continuity tests for verifying the continuous effective contact of the electrodes with the corresponding circuits after mounting the semiconductor IC package on a wiring board because the gap between the semiconductor IC package and the wiring board is very narrow. The gap has progressively been decreased with recent progressive increase in the integration size of semiconductor IC chips, which enhances difficulty in testing the electrical characteristic of semiconductor IC packages after mounting them on wiring boards.

When testing the resin-sealed semiconductor IC package in the sixth embodiment, the probes of a testing device can be brought into contact with the extensions of the leads projecting from the side surfaces of the resin molding. Therefore, the mechanical breakage and deformation of the electrodes can be avoided. The resin-sealed semiconductor IC package can easily be tested even after the same has been mounted on a wiring board by using the extensions of the leads. The extensions of the leads facilitates continuity tests for verifying the continuous effective contact of the electrodes with the corresponding circuits after mounting a resin-sealed semiconductor IC package similar to the resin-sealed semiconductor IC package in the third embodiment having the resin molding provided with the protrusions near the electrodes on a wiring board.

A method of fabricating this resin-sealed semiconductor IC package is basically the same as those of fabricating the resin-sealed semiconductor IC packages in the foregoing embodiments and hence only matters featuring the method will briefly be described.

Figure 29:
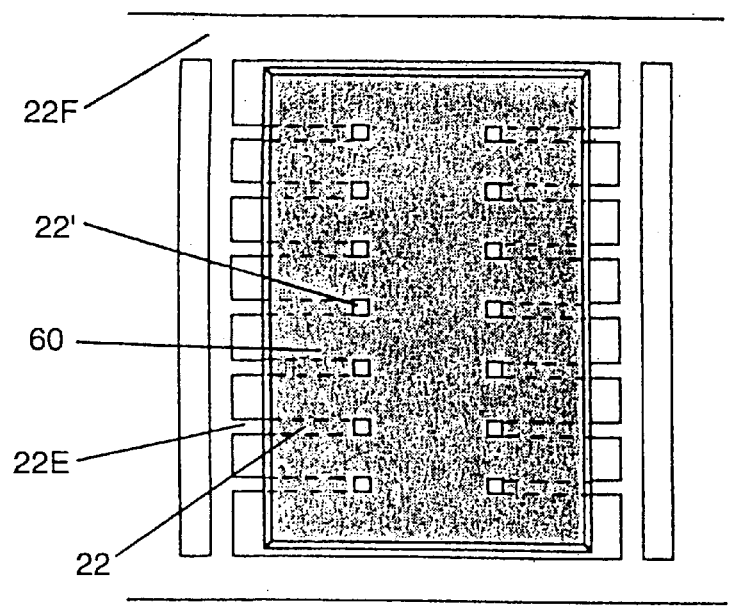
FIG. 29 is a plan view of assistance in explaining a method of fabricating the resin-sealed semiconductor IC package in the sixth embodiment.

The method uses a lead frame 22 provided with leads 22 having extensions 22E as shown in FIG. 29. Semiconductor IC chips are put on the lead frame 22F and are connected to the leads 22, and structures formed by combining the semiconductor IC chips and the leads 22 are subjected to a molding process to form resin-sealed semiconductor IC packages on the lead frame 22F by sealing the semiconductor IC chips in resin moldings.

Figure 30:
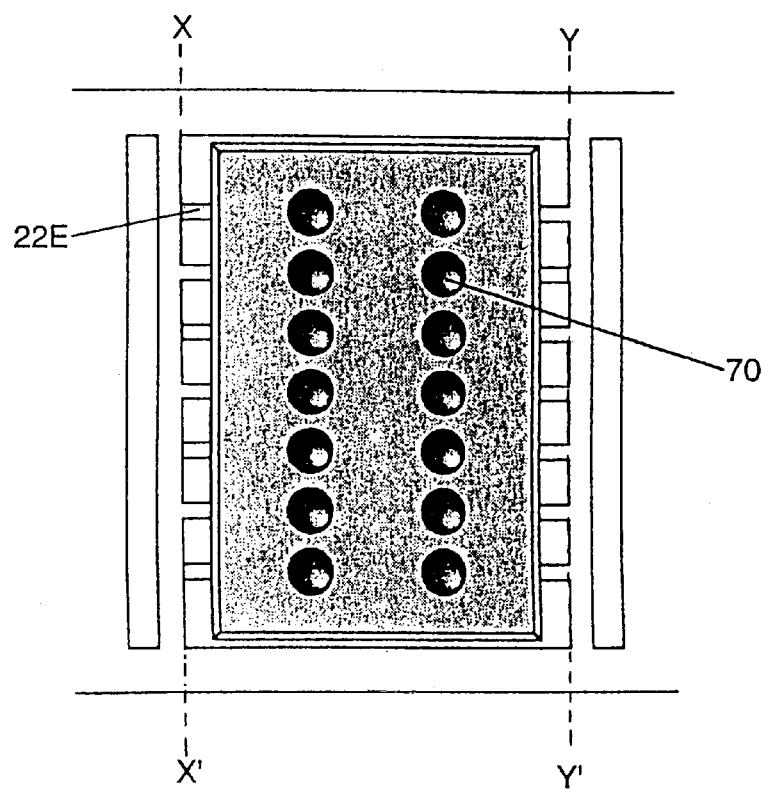
FIG. 30 is a plan view of assistance in explaining a method of fabricating the resin-sealed semiconductor IC package in the sixth embodiment.

The lead frame 22F is subjected to a cutting process to separate the resin-sealed semiconductor IC packages formed on the lead frame 22F by cutting the lead frame 22F along lines X–X' and Y–Y' by press working as shown in FIG. 30. Subsequently, the resin-sealed semiconductor IC package is subjected to a bending process to form the extensions 22E by bending portions of the leads 22 projecting from the side surfaces of the resin molding. The cutting process and the bending process may simultaneously be carried out.

The resin-sealed semiconductor IC package in the sixth embodiment has the following effects in addition to those of the foregoing embodiments. Essential electrical tests of the resin-sealed semiconductor IC package can easily be achieved without damaging the electrodes.

A resin-sealed semiconductor IC package in a seventh embodiment according to the present invention will be described below, in which parts like or corresponding to those of the foregoing embodiments are designated by the same reference characters and the description thereof will be omitted.

The resin-sealed semiconductor IC package in the seventh embodiment is featured by extensions of leads similar to those of the sixth embodiment and extending on one surface of a semiconductor IC chip opposite the other surface of the same on which electrodes are formed.

Figure 31:
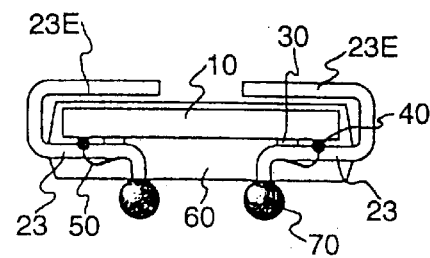
FIG. 31 is a sectional view of a resin-sealed semiconductor IC package in a seventh embodiment according to the present invention.

Referring to FIG. 31, each of leads 23 has one end portion connected to an electrode 70 and the other end portion extending outside from the side surface of a resin molding 60 and extending on a surface of the resin molding 60 opposite the other surface of the resin molding 60 on which the electrodes 70 are formed. A plurality of resin-sealed semiconductor IC packages similar to that in the seventh embodiment can be mounted in a stack on a wiring board 80 as shown in FIG. 32.

Figure 32:
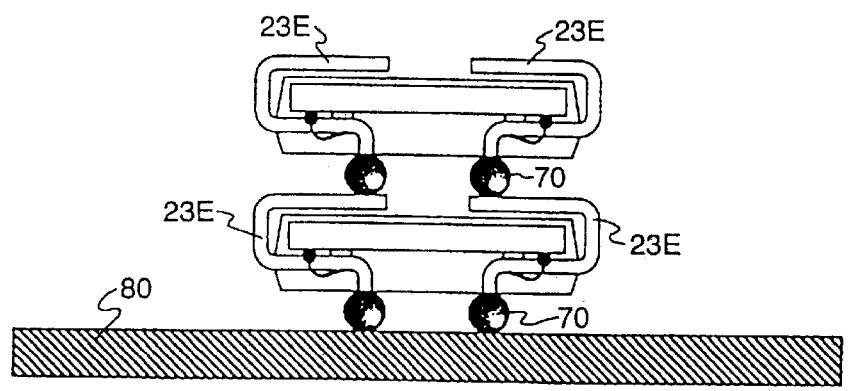
FIG. 32 is a sectional view of a semiconductor IC apparatus constructed by mounting a plurality of resin-sealed semiconductor IC packages similar to that shown in FIG. 31 on a wiring board.
Figure 33:
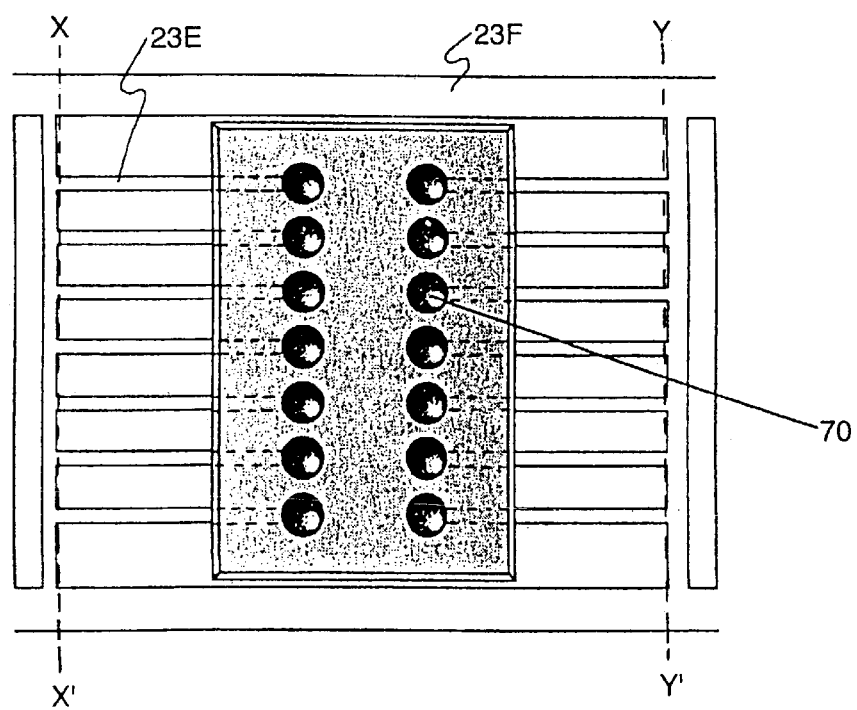
FIG. 33 is a plan view of explaining a method of fabricating the resin-sealed semiconductor IC package in the seventh embodiment.

As shown in FIG. 32, each of the electrodes 70 of the lower resin-sealed semiconductor IC package electrically connected to the wiring board 80 is electrically connected by the lead 23 to the electrode 70 of the upper resin-sealed semiconductor IC package lying directly above the same electrode 70 of the lower resin-sealed semiconductor IC package. Therefore, the same signal is given to the corresponding electrodes 70 of both the resin-sealed semiconductor IC packages from the wiring board 80. A lead frame 23F provided with leads 23 having extensions 23E as shown in FIG. 33 is used to fabricate the resin-sealed semiconductor IC package in the seventh embodiment. The extensions 23E have a length sufficient for the extensions 23E to extend on the surface of the resin molding 60 opposite the other surface of the resin molding 60 on which the electrodes 70 are formed. The length of the extensions 23E is determined properly by the designer, taking into consideration the size and the shape of the resin-sealed semiconductor IC package and the size of the electrodes 70.

The lead frame 23F is subjected to a cutting process to separate the resin-sealed semiconductor IC packages formed on the lead frame 23F by cutting the lead frame 23F along lines X–X' and Y–Y' by press working as shown in FIG. 33. Subsequently, the resin-sealed semiconductor IC package is subjected to a bending process to form the extensions 23E by bending portions of the leads 22 projecting from the side surfaces of the resin molding. The cutting process and the bending process may simultaneously be carried out.

Figure 34:
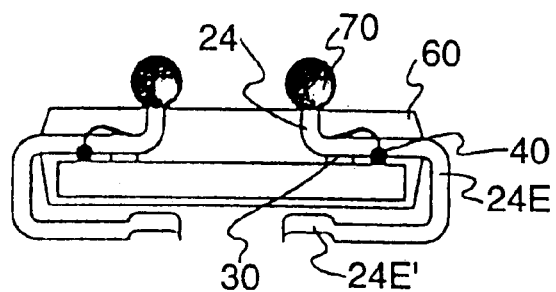
FIG. 34 is sectional view of a resin-sealed semiconductor IC package in an eighth embodiment according to the present invention.
Figure 35:
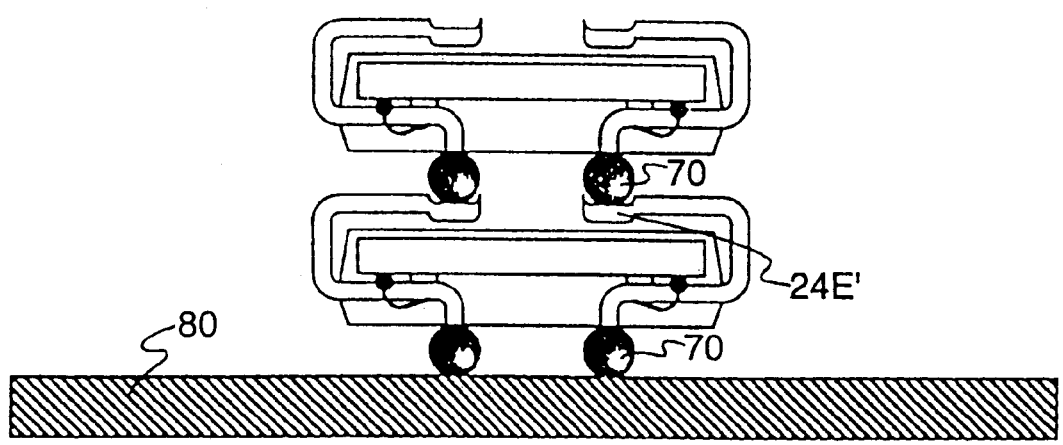
FIG. 35 is a sectional view of a semiconductor IC apparatus constructed by mounting a plurality of resin-sealed semiconductor IC packages similar to that shown in FIG. 34 on a wiring board.

The resin-sealed semiconductor IC package in the seventh embodiment has an effect, in addition to those of the foregoing embodiments, that a plurality of resin-sealed semiconductor IC packages similar to that in the seventh embodiment can be mounted in a stack on a wiring board. A resin-sealed semiconductor IC package in an eighth embodiment according to the present invention will be described below, in which parts like or corresponding to those of the foregoing embodiments are designated by the same reference characters and the description thereof will be omitted. The resin-sealed semiconductor IC package in the eighth embodiment is featured by leads having extensions similar to those of the resin-sealed semiconductor IC package in the seventh embodiment and respectively having concave end portions. Referring to FIG. 34, each of leads 24 has one end portion connected to an electrode 70, and an extension 24E, i.e., the other end portion, extending outside from the side surface of a resin molding 60 and extending on a surface of the resin molding 60 opposite the other surface of the resin molding 60 on which the electrodes 70 are formed and having a concave end portion 24E'. The size of the concave end portion 24E' is determined so that the electrode 70 can be placed on the concave end portion 24E' in close contact with the surface of the concave end portion 24E'. When a plurality of resin-sealed semiconductor IC packages similar to that in the eighth embodiment are mounted in a stack on a wiring board 80 as shown in FIG. 35, the height of the stack of the resin-sealed semiconductor IC packages as shown in FIG. 31 is lower than that of a stack of the resin-sealed semiconductor IC packages as shown in FIG. 31. The connection of the electrodes and the leads of the resin-sealed semiconductor IC packages in the eighth embodiment is more reliable than the connection of the electrodes and the leads of the resin-sealed semiconductor IC packages in the seventh embodiment. A process for forming the concave end portions may be carried out after or simultaneously with a bending process for bending the extensions of the leads. The resin-sealed semiconductor IC package in the eighth embodiment has effects, in addition to the effects that enables mounting a plurality of resin-sealed semiconductor IC packages in a stack on a wiring board, that the height of the stack of the resin-sealed semiconductor IC packages can be reduced and the reliability of the connection of the electrodes and the leads can be enhanced.

As is apparent from the foregoing description, according to the present invention, the resin-sealed semiconductor IC package of a large integration size has a size substantially equal to that of the semiconductor IC chip thereof.

According to the present invention, end portions of the leads can be bent by a known processing method, such as press working, the resin-sealed semiconductor IC package provided with the leads partly exposed on the surface of the resin molding can easily be fabricated by well-controlled processes.

While the invention has been described in its preferred embodiments, those embodiments be construed illustrative and not restrictive, and it is to be understood by those skilled in the art that many changes and variations may be made therein without departing from the scope and spirit of the invention.

What is claimed is:

1. A semiconductor IC package comprising:

a semiconductor IC chip which includes a main surface and a plurality of pads located on the main surface;

a plurality of leads which are located over the main surface of the semiconductor IC chip, each lead being bent so as to include an end portion which extends perpendicularly to the main surface and above the main surface;

a plurality of conductive lines, each conductive line connecting a corresponding one of the leads with one of the pads above a surface the semiconductor IC chip;

a sealing element which seals the main surface of the semiconductor IC chip, the leads and the conductive lines therein, wherein tips of the end portions of the leads are exposed on a surface of the sealing element; and conductive elements which are connected to the exposed tips of the end portions of the leads, wherein the plurality of leads are comprised of a first lead group and a second lead group, wherein the leads of the first lead group extend over the main surface from a first side of the semiconductor IC chip to the surface of the sealing element and the leads of the second lead group extend over the main surface from a second side of the semiconductor IC chip opposite the first side to the surface of the sealing element, wherein the leads of the first lead group are comprised of long leads and short leads arranged alternately so that the tips of the end portions of the first lead group are arranged on two straight lines on the surface of the sealing element, wherein the long leads are longer than the short leads, and wherein the leads of the second lead group are comprised of the long leads and the short leads arranged alternately so that the tips of the end portions of the second lead group are arranged on two straight lines parallel to the two straight lines on which the tips of the end portions of the first lead group are arranged on the surface of the sealing element.

2. A semiconductor IC package comprising:

a semiconductor IC chip which includes a main surface and a plurality of pads located on the main surface;

a plurality of leads which are located over the main surface of the semiconductor IC chip, each lead being bent so as to include an end portion which extends perpendicularly to the main surface and above the main surface;

a plurality of conductive lines, each conductive line connecting a corresponding one of the leads with one of the pads above a surface the semiconductor IC chip;

a sealing element which seals the main surface of the semiconductor IC chip, the leads and the conductive lines therein, wherein tips of the end portions of the leads are exposed on a surface of the sealing element; and conductive elements which are connected to the exposed tips of the end portions of the leads, wherein the sealing element has two protrusions on the surface thereof, each of the protrusions having a height which is equal to or less than that of the conductive elements, wherein the conductive elements are located between the two protrusions.

* * * * *